United States Patent [19]

Kawaguchi et al.

[11] Patent Number: 4,940,934
[45] Date of Patent: Jul. 10, 1990

[54] METHOD OF ELECTRICALLY TESTING ACTIVE MATRIX SUBSTRATE

[75] Inventors: Takao Kawaguchi, Hirakata; Tatsuhiko Tamura, Neyagawa; Etsuya Takeda, Suita, all of Japan

[73] Assignee: Matsushita Electric Industrial Co., Ltd., Osaka, Japan

[21] Appl. No.: 262,340

[22] Filed: Oct. 14, 1988

[30] Foreign Application Priority Data

Oct. 15, 1987 [JP] Japan ................... 62-260305

[51] Int. Cl.$^5$ ................. G01R 31/02; G01R 31/28
[52] U.S. Cl. .................... 324/158 R; 324/158 T; 357/45
[58] Field of Search ............ 324/158 R, 73 R, 73 PC, 324/158 T; 357/45; 371/21, 21.1, 21.6; 365/201; 437/8

[56] References Cited

U.S. PATENT DOCUMENTS

| | | | |
|---|---|---|---|
| 3,988,672 | 10/1976 | Cowart | 324/158 R |
| 4,631,724 | 12/1986 | Shimizu | 324/73 R |
| 4,647,846 | 3/1987 | Malkin | 324/73 R |
| 4,713,607 | 12/1987 | Pepper | 324/73 PC |
| 4,731,759 | 3/1988 | Watanabe | 365/201 |
| 4,779,272 | 10/1988 | Kohda et al. | 371/21 |

FOREIGN PATENT DOCUMENTS 60-209780 10/1985 Japan.
61-12268 4/1986 Japan.

Primary Examiner—Ernest F. Karlsen
Attorney, Agent, or Firm—Lowe, Price, LeBlanc, Becker & Shur

[57] ABSTRACT

In a method of electrically testing an active matrix substrate having a plurality of semiconductor switching devices, a row group of a plurality of parallel conductors and a column group of a plurality of parallel conductors, a gate electrode of each of the semiconductor switching devices being connected to one of the conductors of the row group, and a source electrode of each of the semiconductor switching devices being connected to one of the conductors of the column group, there are provided the steps of short-circuiting the conductors of the row group at both ends thereof; short-circuiting the conductors of the column group at both ends thereof; applying a predetermined voltage between the row and column groups of the conductors; and measuring a current flowing from the row group to the column group of the conductors. Moreover, in determining whether the active matrix substrate is defective, there is also provided the step of determining whether the following formula is satisfied or not:

$$I_1 \leq n \times I_2$$

where $I_1$ is current measured by the step of measuring; $I_2$ is known driving current of each of the semiconductor switching device; and n is a constant.

6 Claims, 5 Drawing Sheets

FIG. 4 PRIOR ART

METHOD OF ELECTRICALLY TESTING ACTIVE MATRIX SUBSTRATE

BACKGROUND OF THE INVENTION

1. Field of the Invention

This invention relates generally to a manufacturing method of an active matrix-type liquid crystal display and particularly to a method of electrically testing an active matrix substrate.

2. Prior Art

Generally, an active matrix-type liquid crystal display-panel is produced by a transistor array substrate producing step, a substrate testing step, a panel assembling step, an image testing step, a defective panel fixing step, and a final inspection step. However, since only a gate-source leakage current test and a disconnection test are performed in the substrate testing step, the defective pixel in the display-panel is detected in the image testing step. Owing to this, there is a disadvantage that even a display-panel having a defective pixel is assembled in the panel assembling step.

SUMMARY OF THE INVENTION

The present invention has been developed in order to remove the above-described drawback inherent to the conventional test method of an active matrix substrate.

It is, therefore, an object of the present invention to provide a new and useful active matrix-type liquid crystal display-panel manufacturing method in which the number of defective pixels in the matrix substrate can be measured in a substrate testing step.

It is another object of the invention to provide a matrix substrate testing method in which the number of defective pixels in the matrix substrate can be obtained before the display-panel is assembled in the panel assembling step.

In accordance with the present invention there is provided a method of electrically testing an active matrix substrate having a plurality of semiconductor switching devices, a first group of a plurality of parallel conductors and a second group of a plurality of parallel conductors which are substantially normal to the conductors of the first group to form a matrix, a control electrode of each of the semiconductor switching devices being connected to one of the conductors of the first group and another electrode of the semiconductor switching devices being connected to one of the conductors of the second group, the method comprising the steps of: short-circuiting the conductors of the first group at both ends thereof; short-circuiting the conductors of the second group at both ends thereof; applying a predetermined voltage between the first and second groups of the conductors; and measuring a current flowing from the first group of the conductors to the second group of the conductors or vice versa.

In accordance with the present invention there is also provided a method of electrically testing an active matrix substrate including a plurality of semiconductor switching devices each having a first electrode indicative of a control electrode, a second electrode, and a third electrode, a plurality of capacitors, a first group of a plurality of parallel conductors, a second group of a plurality of parallel conductors which are substantially normal to the conductors of the first group to form a matrix, and a third group of a plurality of parallel conductors which are substantially normal to one of the conductors of the first and second groups, each first electrode of the semiconductor switching devices being connected to one of the conductors of the first group, each second electrode of the semiconductor switching devices being connected to one of the conductors of the second group, each third electrode of the semiconductor switching devices being connected to one of the conductors of the third group via one of the plurality of capacitors, the method comprising the steps of: short-circuiting the conductors of the first group at both ends thereof; short-circuiting the conductors of the second group at both ends thereof; short-circuiting the conductors of the third group and the conductors of the first group; applying a predetermined voltage between the first and second groups of the conductors; and measuring a current flowing from the first group of the conductors to the second group of the conductors or vice versa.

BRIEF DESCRIPTION OF THE DRAWINGS

The object and features of the present invention will become more readily apparent from the following detailed description of the preferred embodiments taken in conjunction with the accompanying drawings in which:

FIG. 4 is a typical wiring diagram of a thin-film transistor array of the prior art;

The same or corresponding elements and parts are designated at like reference numerals throughout the drawings.

DESCRIPTION OF THE INVENTION

Prior to describing the preferred embodiments of the present invention, the above-mentioned conventional test method of an active matrix substrate will be described for a better understanding of the present invention.

Figure 4:
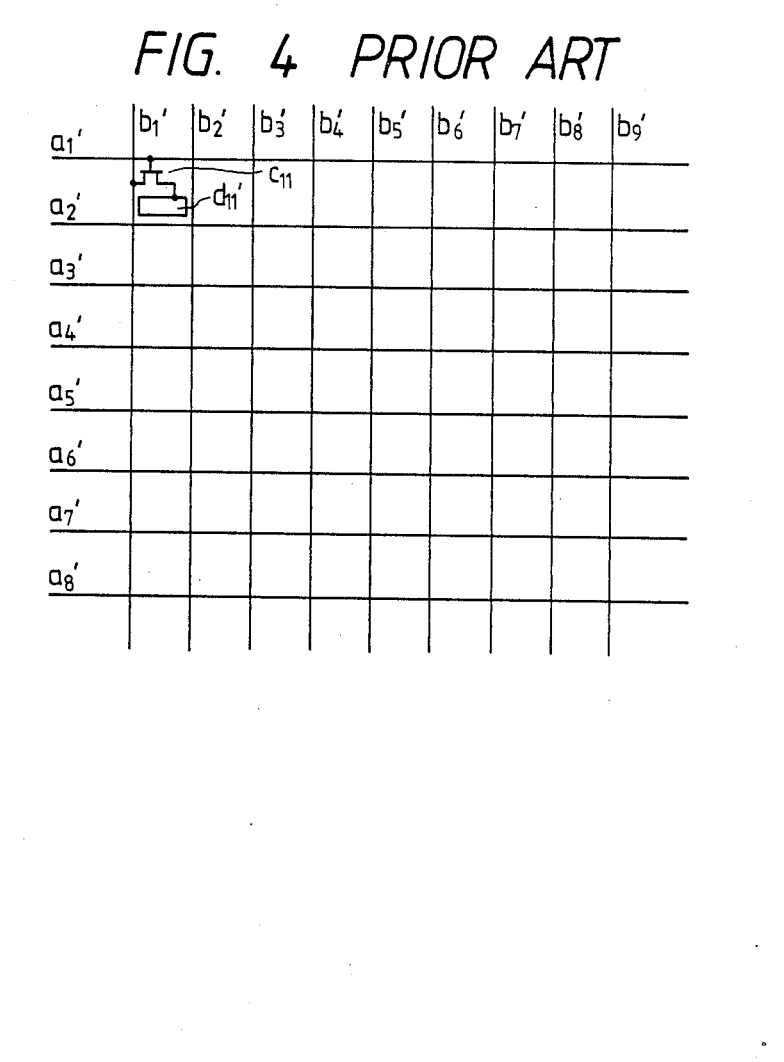

FIG. 4 shows a typical wiring in an active matrix substrate having eight row-wires $a_1'-a_8'$ and nine column-wires $b_1'-b_9'$. Every crossover in the matrix thereof has a pixel electrode $d_{11}'$ and a switching device such as a thin-film transistor $c_{11}'$. The eight row-wires $a_1'-a_8'$ are connected to respective gates of each thin-film transistor $c_{11}'$, and the nine column-wires $b_1'-b_9'$ are connected to respective source of the same. An active matrix-type liquid crystal display-panel is typically assembled by using the active matrix substrate in a panel assembling step.

Figure 5:
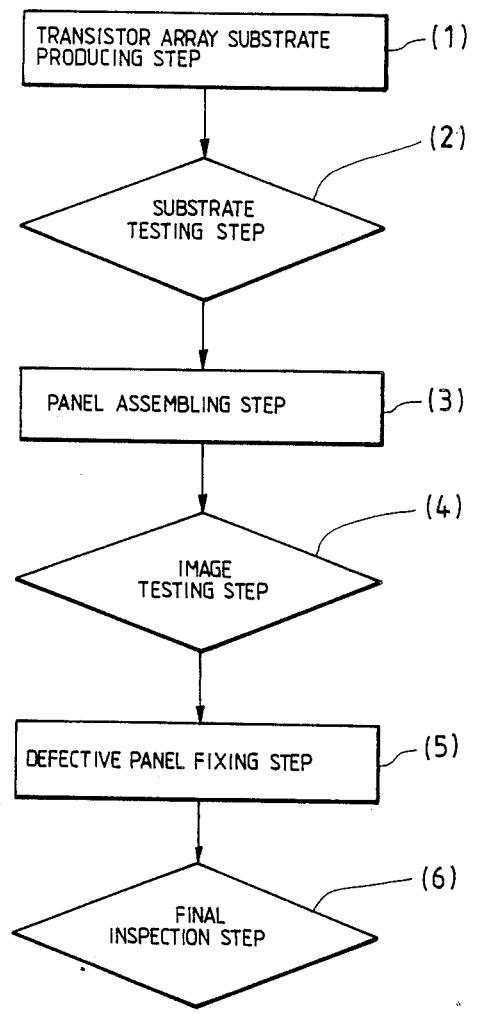
FIG. 5 is a flowchart of a manufacturing step of an active matrix-type liquid crystal display of the prior art.

A flowchart of a general manufacturing step of the active matrix-type liquid crystal display-panel is shown in FIG. 5. In a transistor array substrate producing step (1), the active matrix substrate is produced. A substrate testing step (2) is provided after the transistor array substrate producing step (1) to perform a short-circuit test. In a panel assembling step (3) following the substrate testing step (2), the active matrix-type liquid crystal display-panel is made by sandwiching liquid crystal between the active matrix substrate and the opposing substrate (not shown) having the transparent electrode (not shown). After this panel assembling step (3), the images of such an assembled liquid crystal display panel are electrically tested in an image testing step (4). Here, a defective panel is sent to a defective panel fixing step (5) for fixing the disconnection of wiring, etc. Finally, the inspection of preparation for delivery is performed in a final inspection step (6).

Figure 6:
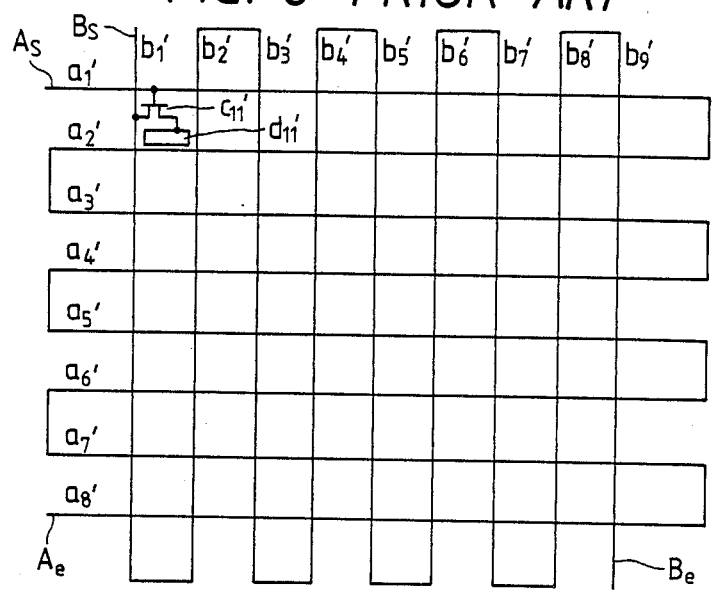
FIG. 6 is a wiring diagram of a thin-film transistor array in a test method of a conventional test process.

In the substrate testing step (2), a wiring of the active matrix is formed for testing a disconnection thereof as shown in FIG. 6. Here, the eight row-wires $a_1'-a_8'$ are connected in series, and therefore, the disconnection thereof can be found by measuring a current between both ends As and Ae. Since the nine column-wires $b_1'-b_9'$ are also connected in series, the disconnection thereof can be found by measuring a current between both ends Bs and Be. Furthermore, a leakage current between gates and sources of the thin-film transistors $c_{11}'$ is measured by applying a voltage between the end portions As and Bs. Such tested matrix substrates are sent to the following panel assembling step (3) on the basis of the result of the above-mentioned test.

Figure 7:
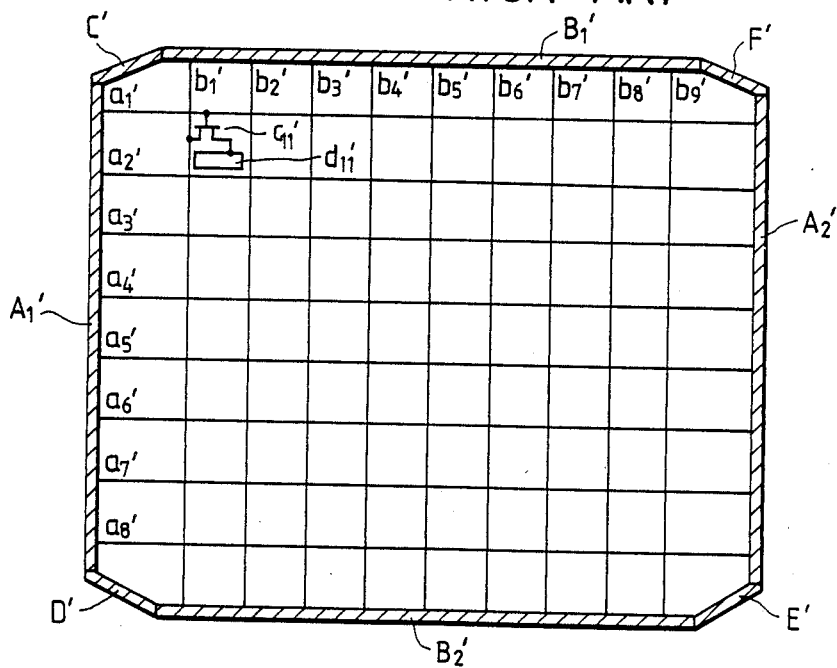
FIG. 7 is a wiring diagram of a thin-film transistor array according to another test method in a conventional assembly process.

In the panel assembling step (3), there is a charge and discharge of static electricity so that the thin-film transistors $c_{11}'$ are apt to deteriorate. Owing to this, the wiring is formed as shown in FIG. 7. A Japanese Provisional Patent Publication No. 60-209780 and a Japanese Patent Publication No. 61-12268 disclose such a wiring structure. In FIG. 7, the eight row-wires $a_1'-a_8'$ and nine column-wires $b_1'-b_9'$ are short-circuited by means of wires $A1', A2', B1', B2', C', D', E',$ and $F'$. Accordingly, no voltage due to the static electricity is applied between the row-wires $a_1'-a_8'$ and the column-wires $b_1'-b_9'$. The wires $A1', A2', B1', B2', C', D', E',$ and $F'$ are disconnected after the assembly in the panel assembling step (3) is finished, and therefore, each of the row-wires $a_1'-a_8'$ and each of the column-wires $b_1'-b_9'$ is separated from each other.

However, in the substrate testing step (2), there are provided only the above-mentioned gate-source leakage current test and the disconnection test. Since a defective pixel is discriminated in the image testing step (4), there is a disadvantage that once in the panel assembling step (3) the display panel is necessarily assembled.

Figure 1:
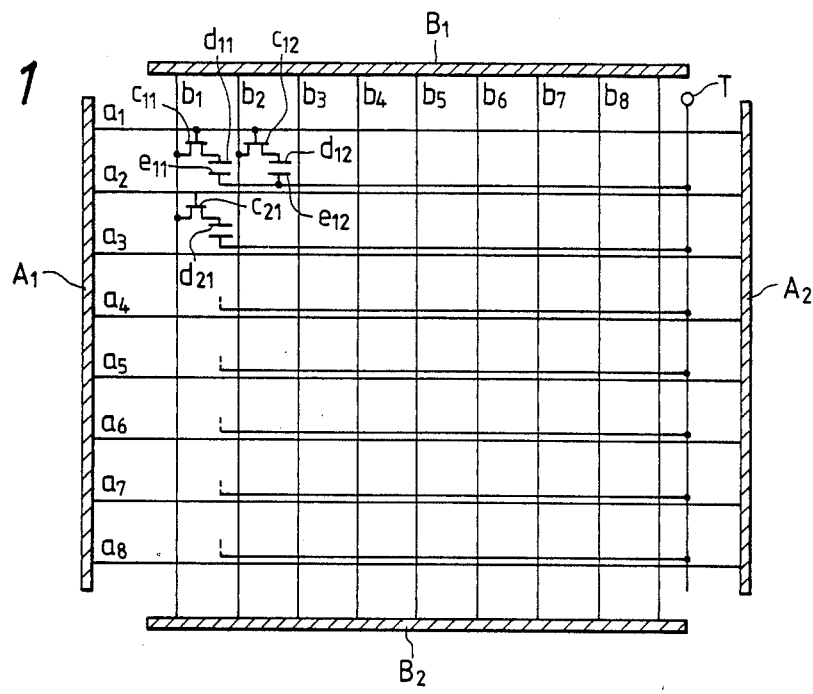
FIG. 1 is one example of a wiring diagram of a thin film transistor array.

It was found out that a short circuit between a gate and a drain of a thin-film transistor is the main cause of defect in thin-film transistors by the present inventors. FIG. 1 shows a wiring diagram in an active matrix substrate having eight parallel row-conductors or row-wires $a_1-a_8$ and nine parallel column-conductors or column-wires $b_1-b_9$ which are substantially normal to the eight row-wires. In each corresponding crossover area of the matrix thereof, a pixel electrode $d_{11}, d_{12}$, etc. and a semiconductor switching device such as a thin-film transistor $c_{11}, c_{12}$, etc. are provided. The eight row-wires $a_1-a_8$ are connected to respective gates or the control electrode of the thin-film transistors $c_{11}, c_{12}$, etc., and the nine column-wires $b_1-b_9$ are connected to respective sources of the same. Respective drains thereof connected to each pixel electrode $d_{11}, d_{12}$, etc. In FIG. 1, each transistor $c_{11}, c_{12}$, etc. is connected to a capacitor having a pixel electrode $d_{11}, d_{12}$, etc. connecting to the corresponding each thin-film transistor $c_{11}, c_{12}$, etc. and a capacitor electrode $e_{11}, e_{12}$, etc. connecting to one terminal T. The eight row-wires $a_{1-a8}$ are short-circuited at the both ends thereof by means of wires or conductors A1 and A2, and the nine column-wires $b_1-b_9$ are short-circuited at the both ends thereof by means of wires or conductors B1 and B2 in the transistor array substrate producing step (1).

Now the electrical test method of the active matrix substrate in a substrate testing step will be described with reference to FIGS. 2A–2C hereinbelow.

Figure 2A:
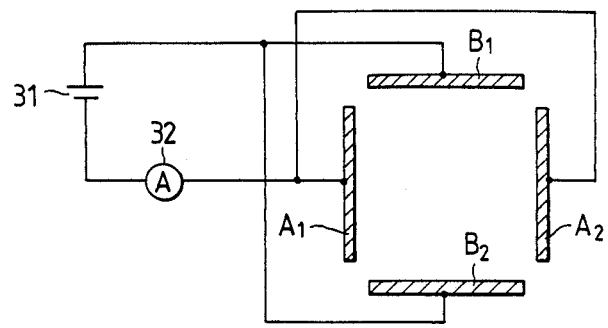
FIGS. 2A-2C are wiring diagrams showing test methods of the invention.
Figure 2B:
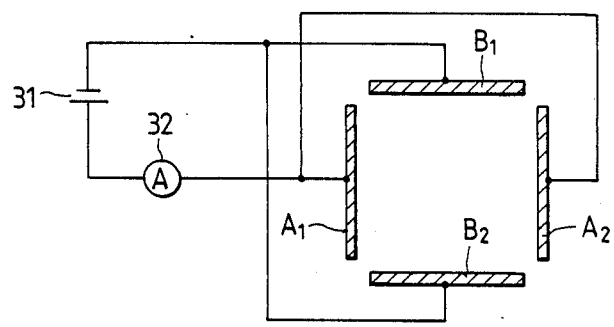
Figure 2C:
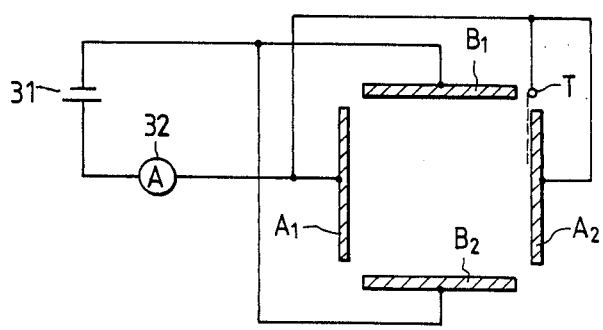

Firstly, a voltage is applied to at least one of the wires B1 and B2 so as to make a current flow from at least one of the wires B1 and B2, via the thin-film transistors $c_{11}$, $c_{12}$, etc., to the at least one of the wires A1 and A2 by using a voltage source 31 as shown in FIG. 2A. This is because a leakage current Igs between the gates and the sources of the thin-film transistors $c_{11}, c_{12}$, etc. is measured by an ammeter 32. Second, a voltage is applied to at least one of the wires A1 and A2 so as to make a current flow from at least one of the wires A1 and A2, via the thin-film transistors $c_{11}, c_{12}$, etc., to at least one of the wires B1 and B2 as shown in FIG. 2B. This is because a leakage current $I_1$ between the gates and the drains of the thin-film transistors $c_{11}, c_{12}$, etc. is measured. Namely, when a higher voltage is applied to the gate thereof, if the gate and drain are in a short-circuited state, the leakage current $I_1$ flows to the source from the drain thereof.

Here, a transistor driving current $I_2$ for switching one of the thin-film transistors $c_{11}, c_{12}$, etc. is previously measured by a characteristic experiment of the thin-film transistor $c_{11}, c_{12}$, etc. The driving current $I_2$ is considerably larger than the leakage current Igs of the same transistor, when this transistor is not defective. Therefore, if the leakage current Igs is zero, the number N of defective pixels is expressed by:

$$N \approx I_1/I_2$$

Subsequently, assuming that a reference n indicates a predetermined acceptable maximum number of the defective pixel in one active matrix substrate, the active matrix substrate is excluded from a consideration of faultless substrates if the following formula is not satisfied:

$$I_1 \leq n \times I_2$$

When the leakage current $I_1$ is satisfies this formula, the active matrix substrate is sent to the panel assembling step (3). As a result, undesired substrates can be sent to the defective substrate fixing step (5) without any image test.

Besides, when the capacity electrode $e_{11}, e_{12}$, etc. is provided and connected to the terminal T, at least one of the wires A1 and A2 and the terminal T are short-circuited. Then, a voltage is applied to at least one of the wires A1 and A2 and the terminal T so as to make a current flow from the at least one of the wires A1 and A2, via the thin-film transistors $c_{11}, c_{12}$, etc., to at least one of the wires B1 and B2 as shown in FIG. 2C. Therefore, a leakage current between the pixel electrode and the capacity electrode is added to the leakage current $I_1$ between the gates and the drains of the thin-film transistors $c_{11}, c_{12}$, etc. Thus, such added current $I_3$ is measured.

Here, if the leakage current Igs is zero, the number M of defective pixels is expressed by:

$$M \approx I_3/I_2$$

Subsequently assuming that a reference m indicates a predetermined acceptable maximum number of the defective pixel in one active matrix substrate, the active matrix substrate is excluded from a consideration of faultless substrates if the following formula is not satisfied:

$$I_3 \leq m \times I_2$$

When the leakage current $I_3$ satisfies this formula, the active matrix substrate is sent to the panel assembling step (3). As a result, undesired substrates can be sent to the defective substrate fixing step (5) without any image test.

As will be understood from the above description, in the present invention, since the row-wires $a_1$-$a_8$ and the column-wires $b_1$-$b_9$ are respectively short-circuited in the panel assembling step (3), there is no transistor deterioration due to a charge and discharge of static electricity even in the panel assembling step (3). Accordingly, the faultless active matrix substrates can be directly sent to the panel assembling step (3).

Figure 3:
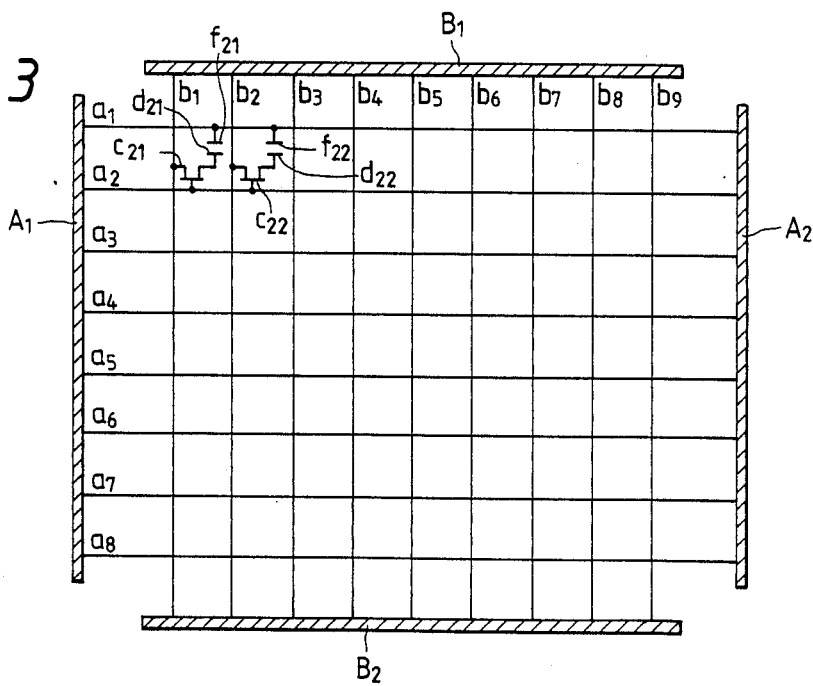
FIG. 3 is another example of a wiring diagram of a thin-film transistor array.

FIG. 3 is another example of a wiring diagram of a thin-film transistor array. FIG. 3 is the same as FIG. 1 except that there are no capacitor electrodes and terminal T. Moreover, thin-film transistors $c_{21}$, $c_{22}$, etc., capacity electrodes $f_{21}$, $f_{22}$, etc., and pixel electrodes $d_{21}$, $d_{22}$, etc. are provided such that the gate of a transistor $c_{nm}$ in the n-th row, the m-th column is connected to the n-th row wire, and the source of the same is connected to the m-th column. The drain of the same is connected to a capacitor defined by a capacitor electrode made of $(a_{n-1})$-th row wire and a pixel electrode $d_{nm}$ as shown in FIG. 3.

The leakage current Igs is also measured first in the similar manner to the first-mentioned present example as shown in FIG. 2A, and then a leakage current between the pixel electrodes $d_{nm}$ and the capacity electrodes $f_{nm}$ is added to the leakage current $I_1$ between the gates and the drains of the thin-film transistors $c_{11}$, $c_{12}$, etc. Thus, such added current $I_4$ is measured.

Here, if the leakage current Igs is zero, the number P of defective pixels is expressed by:

$$P \approx I_4/I_2$$

Subsequently assuming that a reference p indicates a predetermined acceptable maximum number of defective pixels in one active matrix substrate, the active matrix substrate is excluded from a consideration of faultless substrates if the following formula is not satisfied:

$$I_4 \leq p \times I_2$$

When the leakage current $I_4$ satisfies this formula, the active matrix substrate can be sent to the panel assembling step (3). As a result, undesired substrates can be sent to the defective substrate fixing step (5) without any image test.

The above-described embodiments are just examples of the present invention, and therefore, it will be apparent for those skilled in the art that many modifications and variations may be made without departing from the scope of the present invention.

What is claimed is:

1. A method of electrically testing an active matrix substrate having a plurality of thin-film transistors each comprising first and second electrodes and a control electrode, pixel electrodes each having an open end facing said second electrode of each of said thin-film transistors so as to form a capacitor, a first group of a plurality of parallel conductors and a second group of a plurality of parallel conductors which are substantially normal to said conductors of said first group to form a matrix, each of said control electrode of said thin-film transistors being connected to one of said conductors of said first group and each of said first electrode of said thin-film transistors being connected to one of said conductors of said second group, said method comprising the steps of:
   (a) short-circuiting said conductors of said first group at both ends thereof;
   (b) short-circuiting said conductors of said second group at both ends thereof;
   (c) applying a predetermined voltage between said first and second groups of said conductors; and
   (d) measuring a current flowing from said first group of said conductors to said second group of said conductors or vice versa.

2. A method as claimed in claim 1, wherein said step of applying said predetermined voltage is performed to apply a higher potential to said conductors of said first group than that applied to said conductors of said second group, said method further comprising the step of determinining whether the following formula is satisfied or not:

$$I_1 \leq n \times I_2$$

where
   $I_1$: current measured by said step of measuring:
   $I_2$: known driving current of each of said semiconductor switching device; and
   n: a constant.

3. A method of elctrically testing an active matrix substrate including a plurality of semiconductor switching devices each having a first electrode indicative of a control electrode, a second electrode, and a third electrode, a plurality of capacitors, a first group of a plurality of parallel conductors, a second group of a plurality of parallel conductors which are substantially normal to said conductors of said first group to form a matrix, and a third group of a plurality of parallel conductors which are substantially normal to one of said conductors of said first and second groups, each said first electrode of said semiconductor switching devices being connected to one of said conductors of said first group, each said second electrode of said semiconductor switching devices being connected to one of said conductors of said second group, each said third electrode of said semiconductor switching devices being connected to one of said conductors of said third group via one of said plurality of capacitors, said method comprising the steps of:
   (a) short-circuiting said conductors of said first group at both ends thereof;
   (b) short-circuiting said conductors of said second group at both ends thereof;
   (c) short-ciruciting said conductors of said third group and said conductors of said first group;
   (d) applying a predetermined voltage between said first and second groups of said conductors; and
   (e) measuring a current flowing from said first group of said conductors to said second group of said conductors or vice versa.

4. A method as claimed in claim 3, wherein said step of applying said predetermined voltage is performed to apply a higher potential to said conductors of said first group than that applied to said conductors of said second group, said method further comprising the step of determinining whether the following formula is satisfied or not:

$$I_3 \leq m \times I_2$$

where $I_3$: measured by said step of measuring;
$I_2$: known driving current of each of said semiconductor switching device; and
m: a constant.

5. In a method of electrically testing a liquid crystal display panel to identify a defective pixel, the display panel including an active matrix substrate having a plurality of semiconductor switching devices, a first group of a plurality of parallel conductors and a second group of a plurality of parallel conductors which are substantially normal to said conductors of said first group to form a matrix, a control electrode of each of said semiconductor switching devices being connected to one of said conductors of said first group and another electrode of said semiconductor switching devices being connected to one of said conductors of said second group, said method including a substrate testing step followed by a panel assembling step, the improvement comprising, during said substrate testing step:

(a) short-circuiting said conductors of said first group at at both ends thereof;
(b) short-circuiting said conductors of said second group at both ends thereof;
(c) applying a predetermined voltage between said first and second groups of said conductors;
(d) measuring a current flowing from said first group of said conductors to said second group of said conductors or vice versa; and thereby identifying a defective pixel in said substrate testing step prior to assembly of the display panel in said panel assembling step.

6. A method as claimed in claim 5, wherein said step of applying said predetermined voltage is performed to apply a higher potential to said conductors of said first group than that applied to said conductors of said second group, said method further comprising the steps of determining whether said substrate is acceptable or defective by determining whether the following formula is satisfied or not:

$$I_1 \leq n \times I_2$$

where $I_1$: current measured by said step of measuring;
$I_2$: known driving current of each of said semiconductor switching device; and
n: a constant.

* * * * *